Feb. 24, 1953 A. COTSWORTH, III 2,629,817

SUPERHETERODYNE RECEIVING SYSTEM

Filed Oct. 23, 1948 2 SHEETS—SHEET 1

INVENTOR.
ALBERT COTSWORTH III
BY Bruce Burchard
HIS AGENT

Feb. 24, 1953 A. COTSWORTH, III 2,629,817

SUPERHETERODYNE RECEIVING SYSTEM

Filed Oct. 23, 1948 2 SHEETS—SHEET 2

ALBERT COTSWORTH III
*INVENTOR.*

BY Bruce G. Bischoff

HIS AGENT

Patented Feb. 24, 1953 2,629,817

UNITED STATES PATENT OFFICE 2,629,817

SUPERHETERODYNE RECEIVING SYSTEM

Albert Cotsworth, III, Oak Park, Ill., assignor to Zenith Radio Corporation, a corporation of Illinois Application October 23, 1948, Serial No. 56,161

4 Claims. (Cl. 250—20)

This invention relates to signal receiving systems of the superheterodyne type, and more particularly to heterodyning oscillator circuits for use in such systems and improved means for tuning such circuits to selected frequencies within a wide frequency band when the receiving systems are tuned to receive selected signals within a correspondingly wide frequency band.

Television and other signal receivers are usually tuned to receive certain signals in a predetermined frequency band by means of turret tuners or similar devices which act to switch selectively pre-tuned circuits into the radio-frequency amplifier, heterodyne, and heterodyning oscillator stages of the receiver. These pretuned circuits are designed to provide a fixed intermediate-frequency signal at the output of the heterodyne stage, irrespective of the selected signal to which the receiver is tuned. It is therefore apparent that the heterodyning oscillator must be tuned to a separate frequency for each signal selected by the tuning device. In such receivers the heterodyning oscillator is usually tuned to selected frequencies by causing pretuned frequency determining circuits to be switched into the circuit of the heterodyning oscillator as the receiver is tuned from one signal to another. This causes a high percentage of the oscillator circulating current to pass through the switching contacts and adversely affects the stability of the oscillator.

It is therefore an object of this invention to provide such a highly stable oscillator in which a small percentage only of the circulating current passes through the switching contacts.

In usual receivers of the above described type, it is necessary that the heterodyning oscillator be tuned to certain frequencies within a wide frequency range; and to provide such an oscillator, difficulties are encountered in maintaining stability at each of the frequencies to which the oscillator is tuned. It is proposed in the present invention that the receiver tuning device, in addition to tuning various stages of the receiver to the desired respective frequencies, select certain sections of the oscillator and simultaneously tune the selected sections respectively to frequencies corresponding to the respective desired frequency.

It is therefore another object of this invention to provide a highly stable oscillator in a superheterodyne signal receiver that may be tuned by the tuning device of such receiver to certain frequencies within a wide frequency range.

The features of this invention which are believed to be new are set forth with particularity in the appended claims. The invention itself, however, together with further objects and advantages thereof, may best be understood by reference to the following description when taken in conjunction with the accompanying drawings, in which:

In accordance with the present invention the heterodyning oscillator in the signal receiver includes a pair of oscillator sections. One of the sections is tuned to a predetermined frequency by a frequency-determining circuit permanently connected in the circuit of this section, and the second section is tuned to a predetermined frequency different from the frequency of the first section by a further frequency-determining circuit permanently connected in the circuit of the second section. For convenience, these sections are termed "high frequency" and "low frequency" sections. In the described embodiment of the invention, the signal receiver is tuned by a turret tuner and when the receiver is tuned thereby to a first group of selected signals, the tuner selects the first section of the oscillator circuit and selectively switches reactive elements into the circuit of this section to modify the predetermined frequency thereof and, hence, to tune this section to selected frequencies corresponding respectively to selected signals in the first group. When the receiver is tuned to a second group of selected signals, the tuner acts to disable the first section of the local oscillator circuit and select the second section and then to switch selectively reactive elements into the circuit of this section to modify the predetermined frequency thereof and, hence, to tune this second section to selected frequencies corresponding respectively to selected signals in the second group. Although the present system shows two oscillator sections in the local oscillator stage, it is apparent that such sections may be extended to any desired number.

Figure 1:
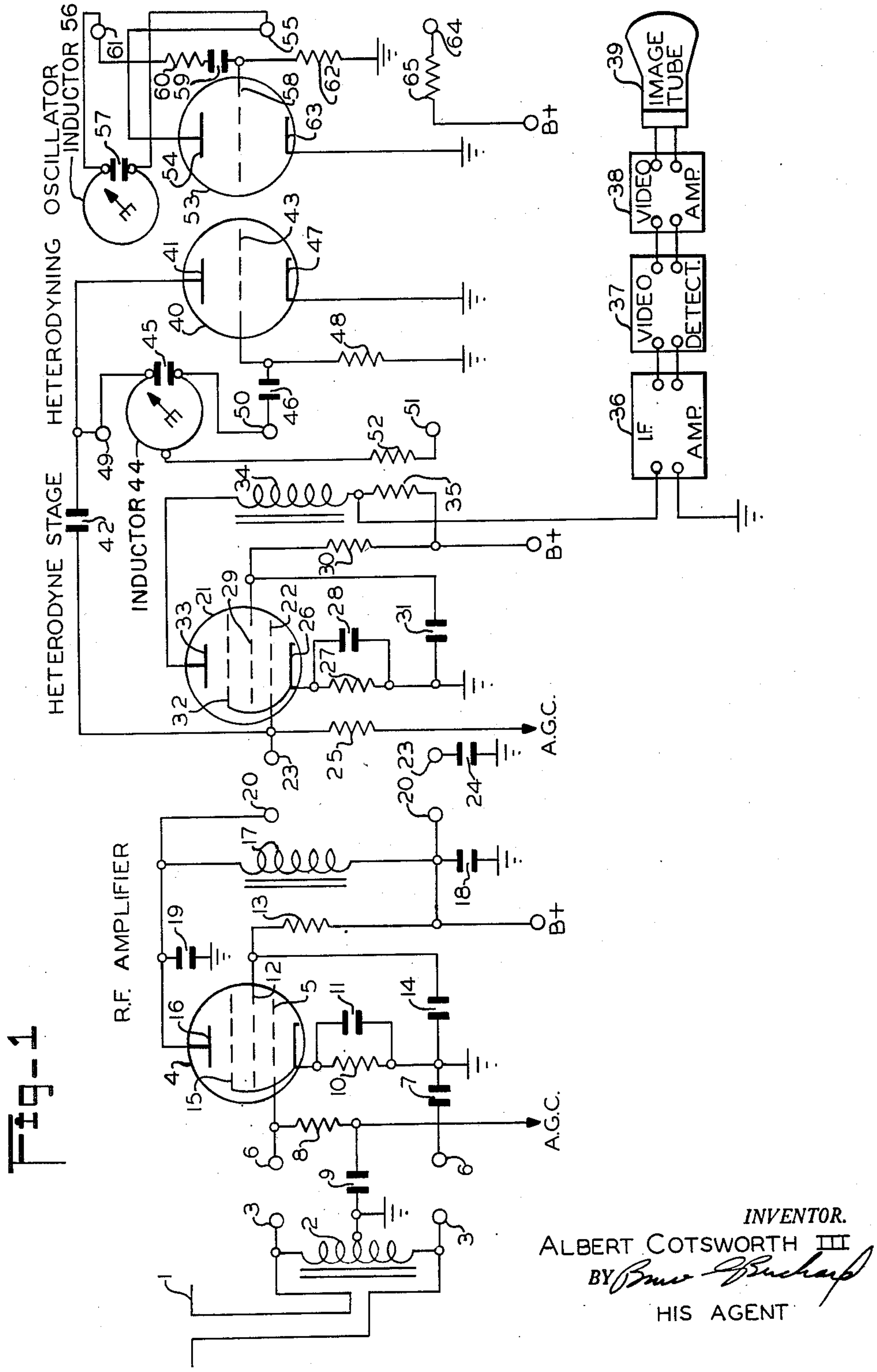
Figure 1 shows a television receiver incorporating the invention.

Figure 1 shows that portion of a television receiver incorporating the invention although it will be apparent that the invention may be applied to any signal receiver of the superheterodyne type. In the circuit of Figure 1, television signals are received on an antenna 1. Antenna 1 is shunted by the usual balancing coil 2, the center tap of this coil being connected to ground and the extremities thereof being connected to switching contacts 3. The radio-frequency amplifier stage of the receiver includes an electron discharge device 4. Control electrode 5 of device 4 is connected to one of the contacts 6, the other contact 6 being coupled to ground through a capacitor 7. Control electrode 5 of device 4 is connected to ground through a series connected grid leak resistor 8 and a capacitor 9, the junction of this resistor and capacitor being connected to an automatic gain control stage, not shown, to complete the direct current path of this control electrode. The cathode of device 4 is connected to ground through a resistor 10 shunted by a capacitor 11. Screen electrode 12 of this device is connected to a positive source, indicated as B+, through a resistor 13, and this electrode is by-passed to ground through a capacitor 14. Suppressor electrode 15 of device 4 is connected to the cathode of this device. Anode 16 of device 4 is connected to source B+ through an inductance coil 17, the extremity of this coil remote from the anode being by-passed to ground through a capacitor 18, and the series connected coil 17 and capacitor 18 is shunted by a trimmer capacitor 19. The anode 16 of device 4 is further connected to the upper one of the contacts 20, and the lower contact 20 is connected to the common junction of coil 17 and capacitor 18.

The heterodyne or first detector stage of the receiver includes an electron discharge device 21. Control electrode 22 of device 21 is connected to upper contact 23, the lower contact 23 being coupled to ground through a capacitor 24. Control electrode 22 of device 21 is connected to the automatic gain control stage of the receiver, not shown, through a resistor 25. Cathode 26 of device 21 is connected to ground through resistor 27 shunted by a capacitor 28. The screen electrode 29 of device 21 is connected to a positive source B+ through a resistor 30, and this electrode is by-passed to ground through a capacitor 31. The suppressor electrode 32 of this device is directly connected to cathode 26. The anode 33 of device 21 is connected to the positive source B+ through a series connected inductance coil 34 and a resistor 35, the common junction of coil 34 and resistor 35 being coupled to the intermediate-frequency amplifier 36 to impress the intermediate-frequency signal thereon. Unit 36 amplifies the intermediate-frequency signal, and the amplified signal is detected in a video detector 37. The detected video signal from detector 37 is applied to a video amplifier 38, and the amplified video signal is impressed on the usual receiver image tube 39. The sound and scanning sections (not shown) of the television receiver form no part of the present invention and may be of any well known design and construction.

The heterodyning oscillator of the receiver consists, in the illustrated embodiment, of a high-frequency and a low-frequency section, although, as previously pointed out, any number of oscillator sections may be used. The high frequency section includes an electron discharge device 40. The anode 41 of this device is coupled to control electrode 22 of discharge device 21 through a capacitor 42, and this anode is coupled to the control electrode 43 of the device 40 through a frequency-determining circuit consisting of an inductor 44 shunted by a capacitor 45, and through a series connected capacitor 46. The cathode 47 of device 40 is directly connected to ground, and the control electrode 43 of this device is connected to ground through a grid leak resistor 48. The anode 41 is further connected to a contact 49, and the common junction of circuit 44—45 and capacitor 46 is connected to a contact 50. A third contact 51 is connected to a point on inductor 44 through a resistor 52. Inductor 44 is made adjustable for trimming purposes, and may have a form similar to that disclosed in copending application Serial No. 43,036, now abandoned, entitled "Variable inductance tuning systems" filed August 7, 1948 by the present inventor and assigned to the present assignee. The low-frequency section of the heterodyning oscillator includes the electron discharge device 53. The anode 54 of this device is connected through a contact 55 to one side of a frequency-determining circuit consisting of an inductor 56 and a shunt capacitor 57. Inductor 56 may be variable for trimming purposes, similar to inductor 44. The control electrode 58 of device 53 is coupled through a capacitor 59, a parasitic oscillation suppressor resistor 60, and a contact 61 to the other side of circuit 56—57. The control electrode 58 is connected to ground through a grid leak resistor 62, and the cathode 63 is directly connected to ground. Contact 64 is connected to a positive source B+ through a resistor 65.

Figure 2:
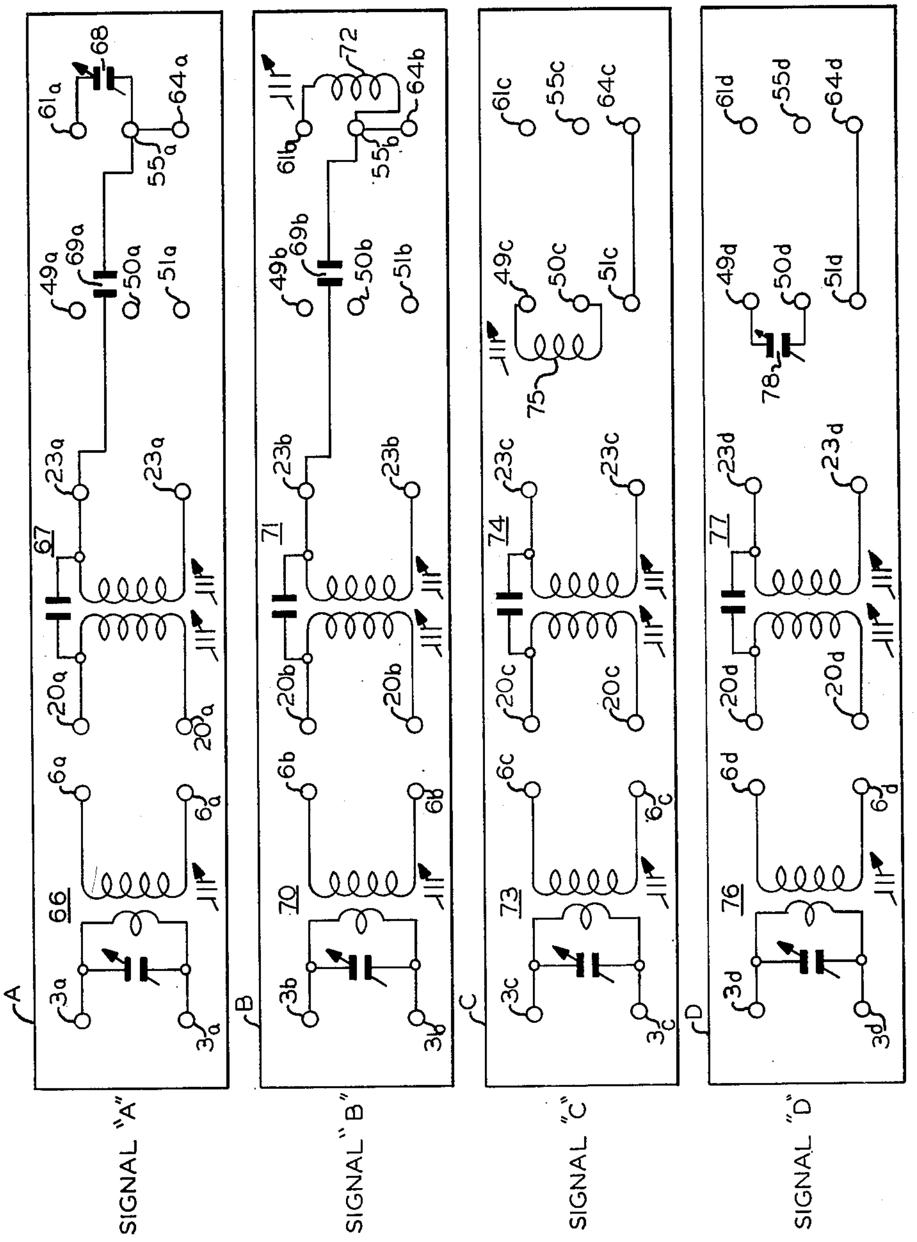
Figure 2 shows various strips on a turret tuner, these strips being adapted to be selectively switched into the receiver circuit to tune the receiver to certain selected signals within a wide frequency band.

Figure 2 shows four typical tuning strips which may be mounted in a turret tuner of conventional construction (not shown) to tune the receiver to receive selected television signals. Rotation of the tuner causes numbered contacts on the individual strips to connect with similar numbered contacts in the circuit of Figure 1. Connection of any strip carried by the turret into the circuit of Figure 1 tunes the receiver to the frequency of a selected signal, this frequency being determined by the adjustments of the various circuit elements carried by the particular strip.

When the tuner is turned so that strip A is connected into the circuit of Figure 1, numbered contacts on strip A connect with correspondingly numbered contacts in the circuit of Figure 1. With such a connection, signals from antenna 1 are applied to the radio-frequency amplifier 4 through a conventional coupling or selector network 66, tuned to the frequency of a first signal, carried by strip A and coupled between contacts 3*a* and 6*a*. The amplified signal from the radio-frequency amplifier 4 is impressed on heterodyne device 21 by way of a similar coupling network 67, also carried by strip A and coupled between contacts 20*a* and 23*a*, and similarly tuned to the frequency of this signal. The high-frequency section of the heterodyning oscillator is disabled by reason of open contacts 49*a*, 50*a* and 51*a*, and the low-frequency section of the oscillator oscillates at a frequency selected to produce the desired intermediate-frequency output of the heterodyne stage. As previously stated, this section of the oscillator has a certain frequency determined by the values of the capacitor 57 and inductor 56. This certain frequency is modified to produce the selected frequency by a capacitor 68 carried by the strip "A" and connected between contacts 61*a*, 55*a*. Slight adjustments when necessary may be made to the selected frequency, by the trimming adjustment of inductor 56, as previously described. Operating potential is supplied to the anode 54 of device 53 by reason of the connection on strip A between contacts 64*a* and 55*a*, and the oscillation at the selected frequency produced by this section of the heterodyning oscillator is injected into the heterodyne stage by way of the coupling on strip A between contacts 55*a* and upper contact 23*a* through a capacitor 69*a*. Hence, when strip A is connected into the receiver circuit, one section of the oscillator is disabled, and the predetermined frequency of the other section is modified to produce a selected oscillation by connecting a pre-tuned capacitor into the circuit 56, 57 of the active oscillator section, this selected oscillation being injected into the heterodyne stage to produce the desired intermediate-frequency signal at the output of this stage.

It can be seen that the major portion of the oscillator frequency-determining circuit, namely tuned circuit 56, 57, is permanently in the oscillator circuit and is not switched. The frequency of the oscillator as determined by the circuit 56, 57 is modified slightly to obtain the selected frequency by switching capacity 63 into its frequency-determining circuit. The major portion of the circulating current in the tank circuit flows through the circuit 56, 57 and not through the switching contacts.

When the turret tuner is turned to tune the receiver to the frequency of a second signal, numbered contacts on tuning strip B connect with similarly numbered contacts in the circuit of Figure 1. In this instance, coupling circuit 70 coupled between contacts 3*b* and 6*b* is connected between the antenna circuit and the radio-frequency amplifier 4. Circuit 70 is tuned to the frequency of this signal and the signal is amplified by the radio-frequency amplifier. Similarly coupling circuit 71, coupled between contacts 20*b* and 23*b*, and tuned to the frequency of the second signal, is connected between the radio-frequency amplifier and heterodyne stage, and the signal amplified by the radio-frequency amplifier 4 is impressed thereby on the heterodyne stage 21. As in the case of strip A, the oscillator section including the device 40 is still disabled since contacts 49*b*, 50*b* and 51*b* are open and the oscillator section including device 53 is active, operating potential being supplied to anode 54 of this latter device by reason of the connection between contacts 64*b*—55*b*. The frequency of this oscillator section as determined by tuned circuit 56, 57 is modified to a second selected frequency by an inductor 72 carried by the strip B and connected between contacts 55*b*—61*b*. The output of this oscillator section at the second selected frequency is injected into the heterodyne stage by way of the coupling between contacts 55*b* and upper contact 23*b* through a capacitor 69*b* on strip B, the second selected frequency being such that the desired intermediate-frequency signal is obtained at the output of the heterodyne stage.

To tune the receiver to a third signal, the turret tuner is again turned until tuning strip C is connected into the receiver circuit. Coupling circuits 73 and 74 are tuned to the frequency of the third signal, and this signal is amplified in the radio frequency amplifier and impressed on the receiver heterodyne stage. When tuning strip C is connected into the receiver circuit, the section of the heterodyning oscillator including device 53 is disabled as there is no operating potential on the anode 54 of this device due to the open connection between contacts 64*c*, 55*c*. However, the section of the oscillator including device 40 is energized as operating potential is supplied to the anode 41 of this device by way of the connection between contacts 64*c* and 51*c* on strip C. The frequency of this section is determined by the values of the circuit components 44, 45, and this frequency is modified by an inductance coil 75 connected between contacts 49*c*—50*c*, on strip C, the coil 75 being adjusted to provide the proper frequency at the local oscillator to produce the desired heterodyne frequency signal at the output of the heterodyne stage, and trimming being effected, when necessary by varying the inductance of coil 44, in a manner similar to inductor 56 as previously described.

Similarly, to tune the receiver to a fourth signal, the turret tuner is again turned until tuning strip D is connected into the receiver circuit. Coupling circuits 76 and 77 are tuned to the frequency of the fourth signal, and this signal is amplified in the radio-frequency amplifier and impressed on the receiver heterodyne stage. The section of the oscillator including device 40 is again used when strip D is connected into the receiver circuit, and the frequency of this section is modified to a selected frequency different than the frequency when strip C is in the circuit. This last mentioned selected frequency is derived by inserting a capacitor 78, which is connected between contacts 49*d*, 50*d* on the strip D, into the active oscillator section. The selected frequency is obtained by adjustment of capacitor 78, and trimming adjustment of coil 44 when necessary.

It is preferable that reactive elements 63, 72, 75 and 78 on the various tuning strips be pre-set to the respective selected frequencies of the local oscillator. The trimmer adjustment of coils 44 and 56 is mounted for control from the receiver panel, so that this adjustment when necessary may be made conveniently.

This invention therefore provides a superheterodyne receiver circuit in which the heterodyning oscillator is capable of being tuned to selected frequencies within a wide frequency range, this tuning being accomplished by the receiver tuning device simultaneously with the tuning by this device of other stages of the receiver, to condition the receiver to receive respective selected signals within a correspondingly wide frequency range.

This invention further provides such a receiver in which the major portion of the frequency-determining circuits of the heterodyning oscillator are permanently connected in the oscillator circuit, whereby circulating current through the switching contacts of the receiver tuning device is reduced to a minimum, and oscillator stability is greatly improved.

While a particular embodiment of the present invention has been shown and described modifications may be made. It is intended in the appended claims to cover all such modifications as fall within the true spirit and scope of the invention.

I claim:

1. A receiver for utilizing wave signals within a wide frequency range including: an input circuit having output terminals; a heterodyne stage having input terminals and including an output circuit for producing an intermediate-frequency signal of a certain frequency; a utilizing device coupled to said output circuit for utilizing said intermediate-frequency signal; an oscillator tunable over a range of operating frequencies, for supplying a heterodyning signal to said heterodyne stage, including an electron-discharge device and a resonant circuit, comprised of principal inductive and capacitive reactive impedances through which the major portion of the oscillatory current of said oscillator circulates, permanently connected to said discharge device and tuning said oscillator to a predetermined frequency within its range and having a pair of terminals connected to the junctions of said principal tuning impedances; a tuning strip supported for selective movement from an inoperative to an operative position with respect to said input circuit, said heterodyne stage and said oscillator; a frequency-selective circuit carried by said strip having input and output terminals for engaging said terminals of said input circuit and said heterodyne stage respectively when said strip is in said operative position to tune said receiver to a particular frequency in said range; and an auxiliary tuning reactive impedance carried by said strip having a pair of terminals for engaging said terminals of said oscillator when said strip is in said operative position to modify the operating frequency of said oscillator to produce said intermediate-frequency signal in the presence of a received signal of said particular frequency.

2. A receiver for utilizing wave signals within a wide frequency range including: an input circuit having output terminals; a heterodyne stage having input terminals and including an output circuit for producing an intermediate-frequency signal of a certain frequency; a utilizing device coupled to said output circuit for utilizing said intermediate-frequency signal; an oscillator tunable over a range of operating frequencies coupled to said heterodyne stage and including an electron discharge device and a resonant circuit, comprised of principal inductive and capacitive reactive impedances through which the major portion of the oscillatory current of said oscillator circulates, permanently connected to said discharge device and tuning said oscillator to a predetermined frequency within its range and having a pair of terminals connected to the junctions of said principal tuning impedances; a tuning strip supported for selective movement from an inoperative to an operative position with respect to said input circuit, said heterodyne stage and said oscillator; a frequency-selective circuit carried by said strip having input and output terminals for engaging said terminals of said input circuit and said heterodyne stage respectively when said strip is in said operative position to tune said receiver to a particular frequency in said range; and an auxiliary tuning reactive impedance carried by said strip having a pair of terminals for engaging said terminals of said oscillator when said strip is in said operative position to modify the operating frequency of said oscillator to produce said intermediate-frequency signal in the presence of a received signal of said particular frequency.

3. A receiver for utilizing wave signals within a wide frequency range including: an input circuit having output terminals; a heterodyne stage having input terminals and including an output circuit for producing an intermediate-frequency signal of a certain frequency; a utilizing device coupled to said output circuit for utilizing said intermediate-frequency signal; an oscillator tunable over a range of operating frequencies, for supplying a heterodyning signal to said heterodyne stage, including an electron-discharge device and a resonant circuit, comprised of principal inductive and capacitive reactive impedances through which the major portion of the oscillatory current of said oscillator circulates, permanently connected to said discharge device and tuning said oscillator to a predetermined frequency within its range and having a pair of terminals connected to the junctions of said principal tuning impedances; a tuning strip supported for selective movement from an inoperative to an operative position with respect to said input circuit, said heterodyne stage and said oscillator; a frequency-selective circuit carried by said strip having input and output terminals for engaging said terminals of said input circuit and said heterodyne stage respectively when said strip is in said operative position to tune said receiver to a particular frequency in said range; an auxiliary tuning reactive impedance carried by said strip having a pair of terminals for engaging said terminals of said oscillator when said strip is in said operative position to modify the operating frequency of said oscillator; and a coupling circuit carried on said strip for coupling said oscillator to said heterodyne stage when said strip is in said operative position to produce said intermediate-frequency signal in the presence of a received signal of said particular frequency.

4. A receiver for utilizing wave signals within a wide frequency range including: an input circuit having output terminals; a heterodyne stage having input terminals and including an output circuit for producing an intermediate-frequency signal of a certain frequency; a utilizing device coupled to said output circuit for utilizing said intermediate-frequency signal; an oscillator tunable over a range of operating frequencies, for supplying a heterodyne signal to said heterodyne stage, including an electron-discharge device and a resonant circuit, comprised of principal inductive and capacitive reactive impedances through which the major portion of the oscillatory current of said oscillator circulates, permanently connected to said discharge device and tuning said oscillator to a predetermined frequency within its range and having a pair of terminals connected to the junctions of said principal tuning impedances; a plurality of tuning strips supported for progressive movement from an inoperative to an operative position with respect to said input circuit, said heterodyne stage and said oscillator; a plurality of frequency-selective circuits respectively carried by said strips each having input and output terminals for selectively engaging said terminals of said input circuit and heterodyne stage respectively when said strips are progressively moved into said operative position to tune said receiver progressively to particular frequencies in said range; and a plurality of auxiliary tuning reactive impedances respectively carried by said strips each having a pair of terminals for selectively engaging said terminals of said oscillator when said strips are progressively moved into said operative position to modify the operating frequency of said oscillator to produce said intermediate-frequency signal in the presence of individually received signals corresponding to said particular frequencies.

ALBERT COTSWORTH, III.

REFERENCES CITED

The following references are of record in the file of this patent:

UNITED STATES PATENTS

| Number | Name | Date |
|---|---|---|
| 2,001,413 | Farnham | May 14, 1935 |
| 2,029,461 | Brush | Feb. 4, 1936 |
| 2,048,828 | Tidd | July 28, 1936 |
| 2,062,379 | Silver | Dec. 1, 1936 |
| 2,137,266 | Case | Nov. 22, 1938 |
| 2,150,553 | Koch | Mar. 14, 1939 |
| 2,173,898 | Conron | Sept. 26, 1939 |
| 2,209,959 | Chittick | Aug. 6, 1940 |
| 2,215,775 | Banfield | Sept. 24, 1940 |
| 2,266,525 | Wendt | Dec. 16, 1941 |
| 2,295,383 | Carlson | Sept. 8, 1942 |

FOREIGN PATENTS

| Number | Country | Date |
|---|---|---|
| 508,924 | Great Britain | July 7, 1939 |